United States Patent [19]

Afian et al.

[11] Patent Number: 4,863,224

[45] Date of Patent: Sep. 5, 1989

[54] SOLAR CONCENTRATOR AND MANUFACTURING METHOD THEREFOR

[76] Inventors: Viktor V. Afian, ulitsa Sevaka, 2, kv. 13; Albert V. Vartanian, Aigestan-10, 2, kv. 57; Ruben G. Martirosian, ulitsa Shinararneri, 27, kv. 32, all of, Erevan; Stanislav V. Ryabikov, pereulok Vasnetsova, 12, kv. 64, Moscow; Dmitry S. Strebkov, Kirovogradsky proezd, 3, korpus 1, kv. 17, Moscow; Eduard V. Tveryanovich, Malo-Kolkhoznaya ploschad, 1, kv. 90, Moscow, all of U.S.S.R.

[21] Appl. No.: 73,721

[22] Filed: Jul. 15, 1987

Related U.S. Application Data

[63] Continuation of Ser. No. 309,044, Oct. 6, 1981, Pat. No. 4,691,994.

[51] Int. Cl.[4] ............................ G02B 5/32; G02B 6/10
[52] U.S. Cl. ...................................... 350/3.7; 350/3.6; 350/96.3
[58] Field of Search .................. 350/3.6, 3.7, 96.3, 350/96.12–96.14, 96.19

[56] References Cited

U.S. PATENT DOCUMENTS

| 4,011,857 | 3/1977 | Rice | 126/270 |
|---|---|---|---|
| 4,021,267 | 5/1977 | Dettling | 136/89 |
| 4,054,356 | 10/1977 | Noguchi | 350/3.5 |
| 4,146,407 | 3/1979 | Litsenko et al. | 136/89 |
| 4,314,283 | 2/1982 | Kramer | 350/96.19 |
| 4,458,979 | 7/1984 | Ross | 350/3.71 |

FOREIGN PATENT DOCUMENTS 2629641 1/1978 Fed. Rep. of Germany .
2342558 9/1977 France .

OTHER PUBLICATIONS

"Concise Dictionary of Physics", by J. Thewlis, 2d Ed., pp. 339 and 80.
"Optical Holography", by Collier et al., Section 1.6, pp. 16–19, Academic Press, New York, 1971.
"Reflecting Holograms", by H. J. Caulfield, Handbook of Optical Holography, Mir Publishers, Moscow, vol. I. Article "Ideal Prism Solar Concentrator", by D. R. Mills and J. E. Grutronich, Solar Energy, 1978, pp. 423–430.
"International Conference on the Use of Solar Energy, The Scientific Basis", Transactions of The Conference, vol. II, Part I, Section B, pp. 213, 214.
"Formation of Optical Elements by Holography", IBM Tech. Disclosure Bulletin, vol. 10, No. 3, Aug. 1967, pp. 268 & 767.
"Holography", by J. W. Goodman, Proceedings of the IEE, v. 59, No. 9, Sep. 1971 (special issue) New York.
R. Collier et al., "Optcial Holography", MIR Publishers, Moscow, 1973, pp. 280–282, 294 and 295.

Primary Examiner—Bruce Y. Arnold
Attorney, Agent, or Firm—Fleit, Jacobson, Cohn, Price, Holman & Stern

[57] ABSTRACT

A solar concentrator comprises a prism having radiation input, reflection and output faces. Located on the input and/or reflection face(s) is a layer of material with a formed three-dimensional hologram of transmitting type in the case of the input face or of reflecting type in the case of the reflection face. The structure of the hologram permits radiation input to the prism at an angle greater than the critical angle of total internal reflection to be reflected within the prism without being diffracted by the hologram.

7 Claims, 2 Drawing Sheets

SOLAR CONCENTRATOR AND MANUFACTURING METHOD THEREFOR

This is a continuation of application Ser. No. 309,044, filed Oct. 6, 1981, now U.S. Pat. No. 4,691,994, issued Sept. 8, 1987.

FIELD OF THE INVENTION

The invention relates to optics, more particularly to solar concentrators and manufacturing methods therefor.

The solar concentrator forming the subject of the present invention may be used in solar power engineering for concentrating solar radiation striking the working surface of a photoconverter.

PRIOR ART

Known in the art is a solar concentrator comprising a prism with a triangular base made of a high-refraction material, wherein radiation is concentrated due to multiple total internal reflections (cf. Mills D. R., Giurtronich J. E., "Ideal Prism Solar Concentrators", Solar Energy, 1978, 21, No. 5, pp 423-430). The prism has radiation input, reflection and output faces. The lower reflection face of the prism has a mirror coating, a dihedral angle between the upper input face of the prism and the reflection face being chosen to provide total internal reflection of a light beam in the prism, said angle being approximately equal to 20°. The reflected beams come out of the prism output face opposite said dihedral angle.

A concentration factor (ratio between areas of the input and output faces) is rather low (about 3). Furthermore, the aforesaid concentrator has large dimensions and weight. Another limitation is that the entira solar radiation spectrum is concentrated, a factor resulting in inefficient conversion of solar energy by a selective receiver, say a photovoltaic cell having maximum sensitivity in a predetermined region of the spectrum.

Also known in the art is a solar concentrator comprising a transparent prism which is a planar sheet (parallelepiped) with luminescent centers dispersed therein, said centers being used to reradiate the incident radiation in a more long-wave spectral region (cf. FRG Pat. No. 2,629,641, 1976). To increase concentration, a reflecting coating is applied to the lower face of the sheet and to all the side faces, except for the output face.

In the foregoing concentrator luminescent radiation is propagated within the sheet in all directions. The luminescent radiation striking the internal surface of the plate within a solid angle smaller than a critical angle for total reflection is lost as it comes out of the sheet. For example, the loss will be about 25% in the case of a glass sheet with a refraction factor or an index of refraction of 1.5. Such a loss may not be fundamentally eliminated. Considerable losses also occur due to self-absorption and radiation reflection from reflecting coatings. Other disadvantages of the prior art luminescent concentrator are difficulties encountered in synthesis of luminophor having suitable spectral characteristics, their instability and a short service life.

Another known solar concentrator (cf. U.S. Pat. No. 4,054,356, 1977) comprises a hologram lens of a point light source. Such a concentrator is easy to manufacture. It is produced by recording in a light-sensitive layer an interference pattern by the use of collimated reference and diverging object laser beams. However, the focal length of such a lens is too long being dependent on the location of a diverging radiation source. An auxiliary facility coupling the receiver to the lens is required to keep the concentrated radiation receiver in the focal plane of the lens. Moreover, energy distribution on the surface of the receiver is generally nonuniform.

Concentrators having no images of radiation sources and providing more uniform distribution of energy on their output surface present much interest at the modern stage of solar power engineering.

BRIEF DESCRIPTION OF THE INVENTION

It is an object of the present invention to decrease energy losses in concentration of solar radiation.

Another object of the invention is to enhance concentration.

A further object of the invention is to expand concentration capabilities in different regions of a solar radiation spectrum.

A still further object of the invention is to provide means for simultaneous separate concentration in different regions of the spectrum on different radiation output surfaces.

One more object of the invention is to simplify production of a solar concentrator.

The foregoing objects are accomplished by that in a solar concentrator comprising a prism having radiation input, reflection and output faces, according to the invention, a layer of material with a formed three-dimensional hologram is located on the input face and/or on the reflection face, the hologram being of transmitting type when disposed on the input face and of reflecting type when disposed on the reflection face, the structure of the hologram being chosen to provide radiation input to the prism at an angle of total internal reflection.

To provide for the possibility of varying spectral characteristics of the solar concentrator within a wide range, an angle between the input and reflection faces is preferably equal to at least a half of angular deviation from the Bragg angle at which diffraction efficiency of the hologram is a minimum.

To increase concentration of solar radiation, the parameters of the hologram are desirably chosen so that radiation in the prism is propagated parallel to the face opposite the face on which the hologram is disposed.

If the prism is a parallelepiped, it is advantageous that the three-dimensional hologram should have nonuniform structure to preclude diffraction of the beam propagated within the prism and reflected from the hologram-air interface.

To increase the concentrated region of the solar radiation spectrum, the three-dimensional hologram advantageously represents a multilayer structure, in which each layer stores information on a source of light having a wavelength different from wavelengths of light sources utilized for forming holograms in the other layers.

To make more efficient use of solar radiation, the number of layers of the three dimensional hologram preferably equals the number of output faces, while the hologram structure in each layer is chosen with due regard for the direction of radiation to the respective output face.

The foregoing objects are also attained by a method of manufacturing a solar concentrator by recording an interference pattern in a light-sensitive layer by using reference and object laser beams, according to the invention, comprises the steps of depositing the light-sensitive layer on the input face and/or on the reflection face of the prism and recording the interference pattern by sending the reference beam in the direction of concentrated radiation and by sending the object beam at an angle of total internal deflection of the materials of the light-sensitive layer and the prism.

To enable a wider choice of concentrated regions within the spectrum when the prism has a trapezoidal base, the object beam advantageously represents light radiation with a flat wave-front directed to one of the nonparallel faces of the prism selected to act as the radiation input and reflection faces.

In this case it is of advantage that an angle of entry of the object-bearing beam to the prism should be chosen from the formula $$\theta' \geq \beta + 2\phi'm,$$

where
- $\theta'$ = angle of incidence of the object beam in the prism on the input face;
- $\beta$ = critical angle for total reflection on the prism-air interface;
- $\phi'$ = angle between the input and reflection faces of the prism; and
- $m$ = maximum number of reflections of the concentrated radiation beam within the prism.

With the solar concentrator comprising a prism with a rectangular base, the object beam preferably represents light radiation with a diverging wave-front whose source is located so that a section on the hologram-air interface between the point of entry of the beam and its first reflection from the hologram-air interface is seen at an angle no less than angular deviation from the Bragg angle at the point of the first reflection at which diffraction efficiency of the three-dimensional hologram is a minimum.

With the solar concentrator having a multilayer hologram advantageously the first light-sensitive layer is topped with at least one more light-sensitive layer and each layer stores an interference pattern by the use of a source of light having a wavelength different from wavelengths of light sources utilized for recording interference patterns on the other layers, the wavelengths of all light sources being chosen with due regard for the absence of a cross modulation effect.

Desirably the number of layers of the three-dimensional hologram is chosen to be equal to the number of the output faces of the concentrator and the interference pattern in each layer is recorded by directing the object beam towards the output face corresponding to the layer.

The solar concentrator in compliance with the invention assures concentration of any region of the solar spectrum, reduces energy losses and permits high concentration. Furthermore, the herein proposed solar concentrator is constructionally simple and contains a minimum number of elements. The concentrator manufacturing method according to the invention is faily simple and saves labour in mechanical treatment of surfaces of optical elements. The proper structure of the volume hologram grating allows more efficient use of the solar spectrum and provides for the possibility of separate concentration of different regions of the spectrum, an advantage attributed to the utilization of sources of light having different wavelengths.

BRIEF DESCRIPTION OF DRAWINGS

The invention will now be described further with reference to specific embodiments thereof, taken in conjunction with the accompanying drawings, wherein.

Figure 1:
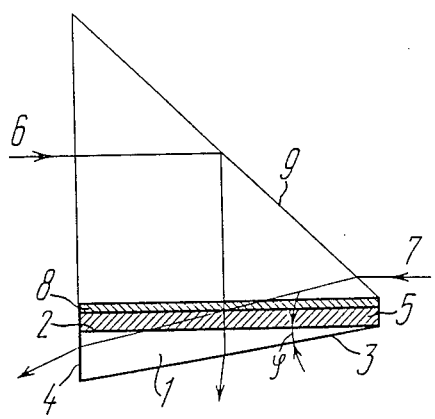
FIG. 1 depicts a solar concentrator and a device for producing a three-dimensional transmission hologram on an input face of a prism with a triangular base according to the invention.

DETAILED DESCRIPTION OF THE INVENTION.

The solar concentrator forming the subject of the present invention comprises prism 1 (FIG. 1) with a triangular base having an input face 2, a reflection face 3 and a radiation output face 4, the input face 2 having a layer 5 of light-sensitive material with a formed three-dimensional transmission hologram. The structure of the hologram grating permits radiation input to the prism at an angle $\theta$ greater than the critical angle of total internal reflection of the material of the prism 1 relative to the air. With the concentrator struck with a beam of light similar to a reference beam 6 utilized in hologram recording, the light beams are propagated inside the prism parallel to the reflection face 3.

In another embodiment of the invention a three-dimensional hologram may be arranged on reflection face 3 (not shown in the drawing). In this case the structure of the diffraction grating assures desired reflecting properties and propagation of radiation within the prism 1 parallel to the radiation input face 2.

Figure 2:
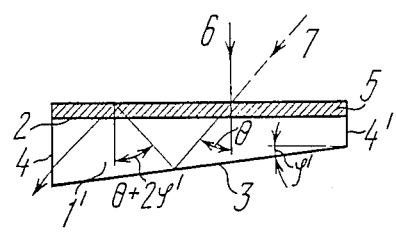
FIG. 2 shows a solar concentrator comprising a prism with a trapezoidal base and a three-dimensional transmission hologram on an input face according to the invention.

The solar concentrator of FIG. 2 comprises a prism 1' with a trapezoidal base and the input and reflection faces 2, 3 respectively, two output faces 4, 4', and the layer 5 of material with a formed three-dimensinal transmission hologram. The faces 2 and 3 are the nonparallel faces of the prism 1'. The parameters of the diffraction grating of the hologram assure that, with the concentrator struck by a beam of light similar to the reference beam 6, it enters the prism at an angle $\theta$ of total internal reflection relative to the input face 2 and is propagated towards the output face 4. A dashed line shows the direction of an object beam 7 in the prism 1' when the diffraction grating of the three-dimensional hologram is formed.

Figure 3:
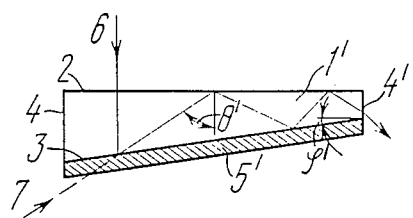
FIG. 3 shows a solar concentrator comprising a prism with a trapezoidal base and a three-dimensional reflection hologram on a reflection face according to the invention.

As distinct from the concentrator of FIG. 2, the concentrator of FIG. 3 has a layer 5' of material with a three-dimensional hologram on the reflection face 3. The structure of the diffraction grating of the reflection hologram is chosen so that a light beam similar to the reference beam enters the prism and is reflected inside it at an angle $\theta$ of total internal reflection, which exceeds the angle $\theta$, said beam being directed towards the smaller output face 4' of the prism.

Figure 4:
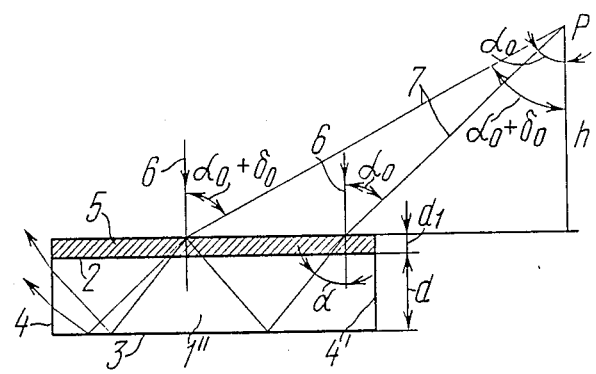
FIG. 4 illustrates a solar concentrator in the form of a parallelepiped and direction of object beams in production according to the invention.

Another embodiment of the solar concentrator illustrated in FIG. 4 comprises a prism 1'' in the form of a rectangular parallelepiped with the input faces 2, 3 respectively, two output faces 4, 4', and the layer 5 of material with a three-dimensional transmission hologram. Unlike the concentrators depicted in FIGS. 1 through 3, the hologram has nonuniform structure to preclude diffraction of the beam propagated within the prism 1'' and reflected from the hologram-air interface.

Figure 5:
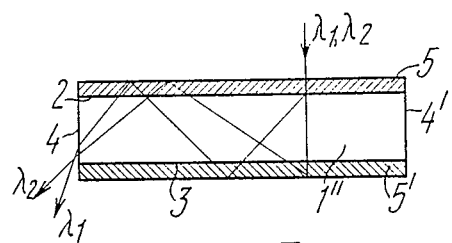
FIG. 5 depicts a solar concentrator in the form of a parallelepiped with a three-dimensional transmission hologram on an input face and a three-dimensional reflection hologram on a reflection face according to the invention.

Turning now to FIG. 5 there is shown another embodiment of the concentrator differing from the concentrator of FIG. 4 in that the reflection face 3 of the prism 1'' is additionally provided with a layer 5' of material having a three-dimensional reflection hologram. The parameters of the diffraction gratings of the holograms are chosen so that a region of the spectrum having a wavelength near $\lambda_1$ is diffracted on the transmitting-type hologram (layer 5), while a region of the spectrum having a wavelength $\lambda_2$ is diffracted on the reflection hologram (layer 5). The radiation from both regions is concentrated on the output face 4.

Figure 6:
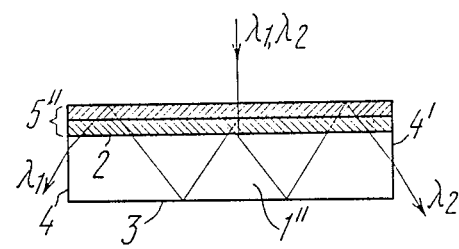
FIG. 6 shows a solar concentrator in the form of a parallelepiped with a two-layer transmission hologram on an input face and two output faces.

One more embodiment of the invention is illustrated in FIG. 6. It differs from the concentrator of FIG. 4 in that the three-dimensional transmission hologram in the layer 5'' is a multilayer structure, the number of the hologram layers being equal to the number of the concentrated radiation output faces. For clarity, FIG. 6 shows a two-layer transmission hologram, one layer of which directs the concentrated radiation having the wavelength near $\lambda_1$ to the output face 4, while its other layer directs the radiation having the wavelength near $\lambda_2$ to the other output face 4'.

The hereinproposed method for manufacturing the solar concentrator of FIG. 1 comprises the following steps. The layer 5 of a suitable light-sensitive material, say photoemulsion, is deposited on the input face 2 of the prism 1. The light-sensitive layer 5 is then topped with a layer 8 of immersion liquid with a refraction factor or an index of retraction close to that of the light-sensitive material, and an auxiliary prism 9 is placed thereon. The auxiliary prism 9 routes the reference beam 6 in the direction of the concentrated radiation and directs the object beam 7 parallel to the reflection face 3. The reference and object laser beams 6 and 7 are then used to record an interference pattern in the light-sensitive layer 5. The transmission hologram will be uniform since the reference and object beams 6 and 7 have a flat wave-front. To obtain a reflection hologram in the concentrator based on a triangular prism, the light-sensitive layer is deposited on the reflection face 3 and the object beam 7 is directed parallel to the input face 2 of the prism 1. In the solar concentrator of FIG. 1 the angle $\phi$ between the input and reflection faces 2 and 3 unambiguously defines the angle between the reference and object beams 6 and 7, respectively. The latter angle determines, in turn, spectral characteristics of the three-dimensional hologram formed in the light-sensitive layer 5.

The spectral characteristics of the concentrator may be varied within wide limits in the embodiment of FIG. 2 with the trapezoidal prism 1'. In production of such a concentrator, unlike the method of manufacturing the concentrator of FIG. 1, the object beam 7 is directed to the prism 1' at a randomly chosen angle of total internal reflection of the material of the prism 1 beginning with a critical angle $\beta$ for total reflection. The object beam 7 represents light radiation with a flat wave-front. Respectively, the angle $\phi'$ between the input and reflection faces 2 and 3 may be chosen in the range from 45° to $\delta/2$, where $\delta$ is angular deviation from the Bragg angle at which diffraction efficiency of the three-dimensional hologram is minimum. To obtain high concentration of the light radiation, the angle $\phi'$ should advantageously be equal to $\delta/2$. The object beam 7 will then be bent to the prism 1 in the direction of the output face 4.

The method of manufacturing the concentrator of FIG. 3 comprises the steps of depositing the light-sensitive layer 5' on the reflection face 3 and recording an interference pattern by directing the reference beam 6 and the object beam 7 to the light-sensitive layer 5' on opposite sides. The object beam 7 enters the prism 1' at an angle $\theta'$ relative to the input face 2 exceeding the critical angle $\beta$ for total reflection by an angle at least equal to the product of the number of beam reflections from the reflection face 3 and the double angle $\phi'$ between the input face 2 and the reflection face 3 of the prism 1'. This condition may be expressed by the relationship $$\theta' \geq \beta + 2\phi'm,$$

where
- $\theta'$ = angle of incidence of the object beam on the input face of the prism;
- $\beta$ = critical angle for total internal reflection on the prism-air interface;
- $\phi'$ = angle between the input and reflection faces of the prism; and
- m = maximum number of reflections of the concentrated radiation beam within the prism.

Besides, the preferred concentrator manufacturing method differs from the method of manufacturing the concentrator of FIG. 2 in that the object beam 7 enters the prism 1' in the direction of the output face 4'.

In the method of manufacturing the concentrator of FIG. 4 the prism 1'' represents a rectangular parallelepiped with the light-sensitive layer 5 deposited on the input face 2, the object beam 7 with a diverging wavefront being used to record the interference pattern. The source P of the object beam 7 is so located relative to the input face 2 that a section on the hologram-air interface between the point of entry of the beam and its first reflection from the hologram-air interface is seen at an angle no less than a half of angular deviation from the Bragg angle at the point of the first reflection at which diffraction efficiency of the three-dimensional hologram is minimum. When the three-dimensional transmission hologram is located on the input face 2; the above condition will be satisfied if $$2(d+d_1)tg\alpha \geq h[tg(\alpha^\circ + \delta^\circ) - tg\alpha^\circ],$$

where
- d = distance between the input and reflection faces;
- $d_1$ = thickness of the three-dimensional hologram;
- h = distance from the object-bearing beam source to the hologram-air interface;
- $\alpha$ = an angle of total internal reflection on the prism-air interface;
- $\alpha^\circ$ = angle of incidence of the object beam interrelated with $\alpha$ by the refraction law; and δ·=angular deviation from the Bragg angle equal to α·/2 at which diffraction efficiency of the three-dimensional hologram is minimum.

In deriving the above relation it has been assumed that the refraction factors of the material layer with the three-dimensional hologram and of the prism are equal (normally they are slightly different). The refraction factor of the medium wherein the source P of the object beam 7 is located differs from the refraction factor of the prism 1″. In a spectral case, when the two factors are equal, the angle α equals α·. Also, the thickness $d_1$ of the three-dimensional hologram is, as a rule, much smaller than the distance d between the input and reflection faces 2 and 3. Thus, it can be neglected. The object beam 7 may be bent at a desired angle, say by the use of the auxiliary prism and the immersion liquid layer on the input face 2.

The method of manufacturing the solar concentrator of FIG. 5 comprises the steps of depositing the light-sensitive layer 5 on one face, say the input face 2 and forming therein a three-dimensional transmission hologram from a source of light having one wavelength ($\lambda_1$). Thereafter said layer is subjected to chemical and photographic treatment. Next, the light-sensitive layer 5′ is deposited on the reflection face 3 to form a three-dimensional reflection hologram from a source of light having a different wavelength ($\lambda_2$), the subsequent step being chemical and photographic treatment of said layer. In production of such a concentrator the wavelength ($\lambda_1$ and $\lambda_2$) of the light sources is chosen with due regard for the absence of a cross modulation effect. FIG. 5 illustrates the concentrator wherein at the production stage the object beams enter the prism 1″ in the direction to the output face 4.

A similar procedure is used to fabricate the concentrator of FIG. 6, wherein the number of layers of the three-dimensional hologram is set to be equal to the number of the output faces. The three-dimensional hologram layer is deposited on the input face 2. Initially, the first light-sensitive layer is applied to form a three-dimensional hologram by directing the object beam towards the first output face 4 and utilizing a source of light having one wavelength ($\lambda_1$). Thereafter the second light-sensitive layer is applied to form a three-dimensional hologram by directing the object beam towards the second output face 4′ and utilizing a source of light having a different wavelength ($\lambda_2$). The subsequent layers may then be applied and the aforementioned operations will be repeated. Likewise the wavelengths $\lambda_1$ and $\lambda_2$ of the light sources are chosen with due account taken of a minimum cross modulation effect, i.e., the light having one wavelength should be diffracted only in its diffraction grating. No interaction should occur with the other layers of the hologram formed from sources of light having different wavelengths. In all embodiments of the invention the concentrators may comprise a prism made of an optically transparent hard material. For, example, thermal conditions of the concentrated radiation receivers may be improved by providing a prism in the form of a solid-state shell filled with a transparent liquid.

The solar concentrator forming the subject of the present invention operates in the following manner. A three-dimensional hologram is a volume diffraction grating with regularly disposed dispersing surfaces. If a light wave similar to one of the two waves used to form the hologram enters such a grating at the Bragg angle, it will be diffracted. A wave identical to the second wave will then be reconstructed. Thus, the object beam 7 will be reconstructed by the three-dimensional hologram formed by the collimated reference beam 6 and the object beam 7 entering the prism at the angle θ of total internal reflection when the reference beam 6 meets the hologram. Consequently, a light beam from the air will enter the prism having greater optical density at an angle of total internal reflection.

The three-dimensional hologram posesses angular selectivity. Stated differently, there exists a relationship between its diffraction efficiency and angular deviation of the light beam from the Bragg angle. The larger the angle between the reference beam 6 and the object beam 7 equal to the double Bragg angle during hologram formation, the smaller will be the permissible angular deviation. Furthermore, the three-dimensional hologram is responsive to the wavelength of light radiation. So, when the hologram is struck by sun light, it may concentrate a certain region of the spectrum depending on the formation conditions. In the concentrator of FIG. 1 a three-dimensional transmission hologram on the input face 2 directs radiation entering the prism 1 parallel to the reflection face 3. As compared with the concentrators of FIGS. 2 and 3, with equal angles between the input and reflection faces 2 and 3, the preferred concentrator concentrates a somewhat narrower region of the spectrum due to a large angle between the reference and object-bearing beams 6 and 7. No reflection of the concentrated light radiation will then occur within the prism.

The concentrator of FIG. 2 operates in the following manner. Light radiation similar to the reference beam 6 strikes the layer 5 of material with the three-dimensional transmission hologram, gets diffracted thereon and enters the prism 1′ at an angle θ of total internal reflection. After reflection from the reflection face 3 inclined at an angle φ′ with respect to the input face 2 the beam reaches the volume hologram-air interface at the angle θ + 2φ′ and is subjected to total internal reflection. The angle φ′ is chosen to be equal to at least a half of angular deviation from the Bragg angle at which diffraction efficiency of said hologram is zero. Since the beam reflected from the volume hologram-air interface meets the dispersing surfaces of the volume hologram with deviation from the Bragg angle equalling 2φ′ at which diffraction efficiency of said hologram is zero, it will not be diffracted thereon. Thus, the direction of the beam will not change and it will come out through the output face after a series of reflections.

In the concentrator of FIG. 3 having a prism with a trapezoidal base the radiation is concentrated on the smaller output face 4′. In the illustrated embodiment the three-dimensional reflection hologram is located on the reflection face 3 in the layer 5′. When the diffraction grating of said hologram is formed, the object beam 6 enters the prism 1′ through the reflection face 3 at the angle θ′. As distinct from the concentrator of FIG. 2, said angle decreases by 2φ′ after each reflection from the face 3. To prevent the beam from leaving the prism 1′ through the input face 2 or the reflection face 3, the angle θ′ should exceed the critical angle β for total reflection by an angle equal to the product of the number of reflections from the reflection face 3 and the double angle between the input and reflection faces 2 and 3 of the prism 1. Such a concentrator may have a three-dimensional transmission hologram on the input face 2 fuctioning in a similar manner. In the preferred embodiment concentration of light radiation is increased and the radiation is concentrated in a narrower region as compared with the concentrator of FIG. 2, an advantage attributed to a smaller area of the output face and a larger angle between the reference and the object-bearing beams.

The solar concentrator of FIG. 4 contains the prism 1″ in the form of a parallelepiped and the layer 5 of material with a three-dimensional transmission hologram on the input face 2. The diffraction grating of said hologram is formed by the collimated reference beam 6 and the diverging object beam 7. Due to the fact that, in production of the concentrator, the diverging object beam 7 enters the prism at an angle of total internal reflection, the radiation beam similar to the reference beam is applied from the air to the prism medium having greater density at an angle of total internal reflection. This is a necessary but insufficient condition for concentrating light radiation. A beam of light diffracted in the three-dimensional hologram enters the prism at a critical angle of total internal reflection, undergoes total internal reflection on the reflection face 3 and, at a certain point, returns to the layer 5 of material with the three-dimensional hologram. A sufficient condition for concentration is that the beam reflected from the volume hologram-air interface does not conform to Bragg's law in the given section of the hologram. Under this condition the beam will not be diffracted on the three-dimensional hologram and will leave the output face 4 after a series of total internal reflections. Therefore, the structure of the diffraction grating of the three-dimensional hologram is nonuniform in the direction of travel of the reflected beam. The nonuniformity is provided by the diverging object beams entering the layer 5 of material at different angles during formation of the hologram.

Selecting the proper distances from the source P (FIG. 4) of the object-bearing beam to the input face 2 and between the input and reflection faces 2 and 3 assures incidence of the beam reflected from the volume hologram-air interface on the hologram with such angular deviation from the Bragg angle in the given section that diffraction efficiency of the three-dimensional hologram in said section is zero. Since the three-dimensional hologram posesses angular selectivity, it may not produce a diffracting effect on the beam having predetermined angular deviation from the Bragg angle.

Depending on the geometry of the diverging object beam having a given wavelength, in production of the concentrator the light radiation may be concentrated on two and more output faces of the prism, on a portion of the output face or at any point on the prism.

The concentrators of FIGS. 5 and 6 operate esentially in the above manner, except that, in the concentrator of FIG. 5 the radiation from the transmission hologram (layer 5) and the reflection hologram (layer 5) is concentrated on one output face 4, while in the concentrator of FIG. 6 the radiation from each layer of the transmission hologram is concentrated on the respective output face 4 or 4′.

Since the three-dimensional hologram posesses both angular and spectral selectivity, its diffraction efficiency decreases with deviation from the Bragg wavelength with the light beam striking the surface at the Bragg angle. Thus, in all embodiments of the invention a multilayer three-dimensional hologram may be replaced by a single-layer hologram of sufficient thickness. The volume diffraction gratings from different light sources are superimposed one upon another, and each diffraction grating separates its region of the spectrum with beams of white light falling at the Bragg angle. The cross modulation effect will be minimum if the wavelengths of the light sources noticeably differ.

The scope of the invention is not limited to specific embodiments described. The preferred embodiments illustrate the various structures and properties of novel solar concentrators based on the utilization of three-dimensional holograms and the total internal reflection effect.

The solar concentrator in compliance with the invention permits obtaining increased concentration as compared with the prior art concentrators utilizing a prism with total internal reflection. The method of manufacturing the concentrator according to the invention allows fabricating solar concentrators over a fairly wide spectral selectivity range: from narrow-band concentrating filters with a spectrum region several nanometres wide to concentrators which do not virtually possess spectral selectivity. Separate concentration of different regions of the spectrum on different output faces permits the utilization of several selective light radiation receivers having maximum sensitivity on different wavelengths with one concentrator, a feature substantially enhancing efficiency of the concentrator and expanding its capabilities. The concentrator forming the subject of the present invention is constructionally simple and has a minimum number of elements. It also boasts of operational reliability. The method of manufacturing said concentrator saves labour in mechanical treatment thereof and comprises a minimum number of steps, which is generally a time-saving factor for production process takes just a few minutes.

What is claimed is:

1. A solar concentrator comprising an optically transparent prism; a radiation input face of said prism; a reflection face of said prism; at least one radiation output face of said prism; volume transmission hologram means on said radiation input face having a diffraction structure that enables radiation input to said prism through said input face at an angle greater than a critical angle of total internal reflection of a material of said prism relative to the air and said input face, said reflection face and said hologram means coacting to produce multiple reflections of said radiation input at an angle of total reflection within said prism, at a preselected angular deviation from the Bragg angle for which the diffraction efficiency of said hologram means is a minimum.

2. A solar concentrator according to claim 1, wherein said hologram means is a multilayer structure, in which said layers store information on mutually exclusive sources of light having different wavelengths.

3. A solar concentrator according to claim 2, wherein the prism has a number of output faces and the number of said layers of said hologram means is equal to the number of said output faces with the structure of each said layer being preselected for directing radiation to a particular output face.

4. A solar concentrator comprising an optically transparent prism with a rectangular base; a radiation input face of said prism; a reflection face of said prism; at least one radiation output face of said prism; volume transmission hologram means on said radiation input face having a non-uniform diffraction structure that enables radiation input to said prism through said input face at an angle greater than a critical angle of total internal reflection of a material of said prism relative to the air but precludes diffraction of the beam being propagated within said prism with total reflection and said input face, said reflection face and said hologram means co-acting to produce multiple reflections of said radiation input at an angle of total reflection within said prism, at a preselected angular deviation from the Bragg angle for which the diffraction efficiency of said hologram means is a minimum.

5. A method of manufacturing a solar concentrator based on a prism with a rectangular base having a radiation input face, a reflection face and at least one radiation output face, comprising the steps of: depositing a layer of light-sensitive material on at least one of said faces chosen from a group composed of the input face and the reflection face of the prism; recording an interference pattern in said light-sensitive layer by using reference and object laser beams; sending said reference laser beam to said light-sensitive layer in the direction of said concentrated radiation; said object laser beam representing light radiation with a diverging wave-front, a source of said light radiation being arranged so that a section on the hologram-air interface between a point of entry of the object laser beam and a point of its first reflection from the hologram-air interface is seen at an angle no less than angular deviation from the Bragg angle at the point of said first reflection at which diffraction efficiency of said three-dimensional hologram is a minimum.

6. A method of manufacturing a solar concentrator based on a prism with a rectangular base having a radiation input face, a reflection face and at least one radiation output face, comprising the steps of: depositing a layer of light-sensitive material on at least one of said faces chosen from a group composed of the input face and the reflection face of the prism; recording an interference pattern in said light-sensitive layer by using reference and object laser beams; sending said reference laser beam to said light-sensitive layer in the direction of said concentrated radiation; said object laser beam representing light radiation with a diverging wave-front, a source of said light radiation being arranged so that a section on the hologram-air interface between a point of entry of the object laser beam and a point of its first reflection from the hologram-air interface is seen at an angle no less than angular deviation from the Bragg angle at the point of said first reflection at which diffraction efficiency of said three-dimensional hologram is a minimum, wherein the first light-sensitive layer is topped with at least one more light-sensitive layer and each of said layers stores an interference pattern by the use of a source of light having a wavelength different from wavelengths of light sources utilized for recording interference patterns on said other layers, the wavelengths of all said light sources being chosen with due regard for the absence of a cross modulation affect.

7. A method of manufacturing a solar concentrator as claimed in claim 6, wherein the number of said layers of said three-dimensional hologram is chosen to be equal to the number of said output faces of the concentrator and said interference pattern in each layer is recorded by directing said object laser beam towards said output face corresponding to the respective layer.

* * * * *